(12) United States Patent
Wilson

(10) Patent No.: US 7,861,073 B2
(45) Date of Patent: Dec. 28, 2010

(54) ON-CHIP DECOMPRESSION ENGINE

(75) Inventor: Thomas James Wilson, Pleasanton, CA (US)

(73) Assignee: Apple Inc., Cupertino, CA (US)

( * ) Notice: Subject to any disclaimer, the term of this patent is extended or adjusted under 35 U.S.C. 154(b) by 901 days.

(21) Appl. No.: 11/650,183

(22) Filed: Jan. 3, 2007

(65) Prior Publication Data

US 2008/0162920 A1 Jul. 3, 2008

(51) Int. Cl.
*G06F 9/30* (2006.01)
(52) U.S. Cl. .......................... 713/1; 379/88.1; 708/203; 710/68; 348/14.13; 341/107
(58) Field of Classification Search .................. 713/1; 708/203; 710/68; 379/88.1; 348/14.13; 341/107
See application file for complete search history.

(56) References Cited

U.S. PATENT DOCUMENTS

| | | | |
|---|---|---|---|
| 5,483,261 A | 1/1996 | Yasutake | |
| 5,488,204 A | 1/1996 | Mead et al. | |
| 5,636,352 A * | 6/1997 | Bealkowski et al. | 712/208 |
| 5,825,352 A | 10/1998 | Bisset et al. | |
| 5,835,079 A | 11/1998 | Shieh | |
| 5,867,681 A | 2/1999 | Worrell et al. | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,332,175 B1 | 12/2001 | Birrell et al. | |
| 6,385,670 B1 * | 5/2002 | Spilo et al. | 710/26 |
| 6,690,387 B2 | 2/2004 | Zimmerman et al. | |
| 6,954,615 B2 | 10/2005 | Sano | |
| 7,015,894 B2 | 3/2006 | Morohoshi | |
| 7,184,064 B2 | 2/2007 | Zimmerman et al. | |

(Continued)

FOREIGN PATENT DOCUMENTS

EP 1028425 8/2000

(Continued)

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner*—Abdelmoniem Elamin
(74) *Attorney, Agent, or Firm*—Morrison & Foerster LLP

(57) ABSTRACT

Embodiments of the present invention are directed to a microcontroller which includes a Register Load Assist engine. The microcontroller can include no or minimal non-volatile memory which stores boot data. Thus, most of the boot data can be stored at a non-volatile memory external to the microcontroller. An external circuit can read the externally positioned non-volatile memory and send compressed boot data to the microcontroller. The boot data can be originally stored in compressed form in the external non-volatile memory or it can be compressed by the external circuit. The boot data can be received by the microcontroller and saved in an intermediate location in the microcontroller's internal volatile memory. The RLA engine can then uncompress the boot data and store various portions of it in their final destinations (such as, for example, in respective registers).

45 Claims, 8 Drawing Sheets

U.S. PATENT DOCUMENTS

2002/0199083 A1* 12/2002 Kao et al. .................... 712/209
2005/0198471 A1* 9/2005 Yamada et al. ............... 712/210
2006/0026521 A1 2/2006 Hotelling et al.
2006/0097991 A1 5/2006 Hotelling et al.
2006/0197753 A1 9/2006 Hotelling

FOREIGN PATENT DOCUMENTS

| JP | 2000-163031 A | 6/2000 |
|---|---|---|
| JP | 2002-342033 A | 11/2002 |
| WO | WO-03/023786 | 3/2003 |

OTHER PUBLICATIONS

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner though in the following description, RLA engine 104 is described as being used to load boot data into register file 102, in fact it can be used to load data into any storage element of the microcontroller. Additionally, the RLA engine can load various data and not just initial register values. For example, the RLA engine can be used to load any instructions or data, such as those which are to be used by the processor 101.

ON-CHIP DECOMPRESSION ENGINE

FIELD OF THE INVENTION

This invention relates to electronic devices, and more particularly, to microcontrollers comprising on-chip decompression engines.

BACKGROUND OF THE INVENTION

Microcontrollers are often used in computing and electronics, especially for controlling various small electronic devices. A microcontroller is often referred to as "a computer on a chip." In other words, it is usually a single chip which includes a generally programmable processor as well as various memories and interfaces required to allow the generally programmable processor to operate. A microcontroller may thus be compared to a computer which usually requires several chips placed on a board (some times referred to as motherboard) to achieve the functionality of a microcontroller.

For efficiency reasons, many microcontrollers include at least one serial interface. While serial interfaces can be slower, they may be more efficient as they require fewer pins.

Many microcontrollers require a boot-up process when initially powered up. The boot-up process allows a microcontroller to perform various actions to prepare the microcontroller for ordinary operation, such as load initialization values in its registers, load instructions in its instruction memory, etc.

Some microcontrollers include on board non-volatile memory, such as read-only memory (ROM), which is used in the boot up process. More specifically, the microcontroller loads initial register values, instructions etc., from the internal ROM.

However, use of internal ROM to store boot up information may be undesirable in that it prevents changes and modifications from being made to the microcontroller's boot operation. For example, changing the initial value of one register would require changing the entire microcontroller, which can be expensive, especially if a number of microcontrollers with the old register value have already been manufactured. Thus, removing errors in a microcontroller's boot operation becomes difficult if all boot data of a microcontroller is stored internally in a ROM.

However, storing the boot data outside of the microcontroller poses other difficulties. Namely, the boot data must be sent to the microcontroller during a boot operation. This can take a long time, especially if a serial interface to the microcontroller is used. A time consuming boot sequence is generally undesirable, especially if the microcontroller is used for a consumer device, because it gives the impression that the device is slow and lacks computational power.

SUMMARY OF THE INVENTION

Embodiments of the present invention are directed to a microcontroller which includes a Register Load Assist (RLA) engine. The microcontroller can include zero or minimal non-volatile memory which stores boot data. Thus, most of the boot data can be stored at a non-volatile memory external to the microcontroller.

An external circuit can read the externally positioned non-volatile memory and send compressed boot data to the microcontroller. The boot data can be originally stored in compressed form in the external non-volatile memory or it can be compressed by the external circuit. The boot data can be received by the microcontroller and saved in an intermediate location in the microcontroller's internal volatile memory. The RLA engine can then decompress the boot data and store various portions of it in their final destinations (such as, for example, in respective registers).

Thus, by allowing the remote receipt of compressed boot data, the RLA engine provides for a microcontroller which can receive a large amount of boot data from an external source, but nevertheless feature a relatively fast boot-up sequence.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention can be practiced. It is to be understood that other embodiments can be utilized and structural changes can be made without departing from the scope of the preferred embodiments of the present invention.

Although embodiments of the present invention are described herein in terms of microcontrollers for portable electronic devices, it should be understood that the present invention is generally applicable to any microcontrollers, or any similar circuits that require a boot sequence which in turn requires a significant amount of boot data. An embodiment of the present invention is directed to a microcontroller which features an internal RLA engine which facilitates unpacking and storing boot data.

Figure 1:
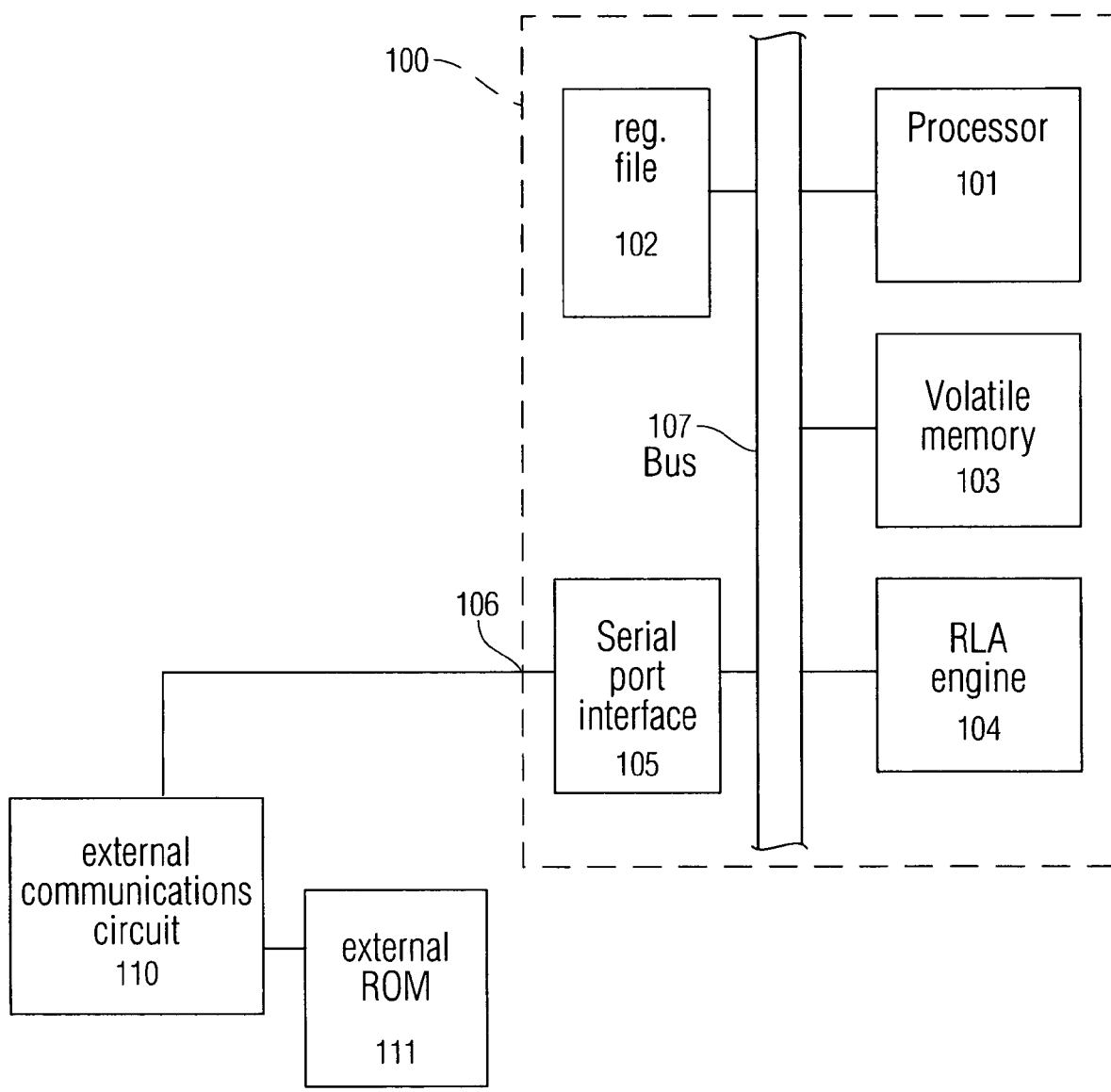
FIG. 1 is a diagram of an exemplary microcontroller and various related components according to one embodiment of this invention.

FIG. 1 is a diagram of a microcontroller and various related components according to one embodiment of this invention. Microcontroller 100 can include a programmable processor 101. Register file 102 can include various registers which are used by the processor 101 in the ordinary operation of the microcontroller. The microcontroller can require that certain specific predefined initial values are stored in one or more of the registers of the register file before the microcontroller assumes ordinary operation. Since the register file is usually composed of volatile memory, the initial values can be stored in the register file as part of an initialization or boot operation. Therefore, these initial values can be a part of boot data that is loaded in the microcontroller during a boot-up procedure.

Volatile memory 103 is also included in the microcontroller. The volatile memory can store data or instructions. The data or instructions can be used by processor 101, or other elements of the microcontroller, such as RLA engine 104.

Serial port 106 connects microcontroller 100 with various external modules. Serial port 106 need not be the only such connection. In certain embodiments, the serial port can be a parallel port. Serial port interface 105 provides functionality for processing communications to or from serial port 106. Thus, the serial port interface can receive communications from the serial port, reformat them and forward them to other elements in microcontroller 100. Alternatively, the serial port interface can receive communications from internal modules and forward them to external elements.

Bus 107 is used for communications between the various modules of the microcontroller. The bus may allow each module to communicate with each other module according to known protocols. The bus can feature, for example, a master-slave type of communications protocol. The bus can also feature a type of master-slave communications protocol in which multiple modules (such as, e.g., processor 101, serial port interface 105, RLA engine 104) can be masters. In such case, microcontroller 100 can also include a bus arbiter (not shown) which resolves any conflicts which may arise from situations in which multiple masters attempt to use the bus at the same time. In one embodiment, the bus has a much faster transfer speed than the serial port 106. A person of skill in the art would recognize that microcontroller 100 can include other elements as well.

Port 106 can be connected to one or more external elements such as, for example, external communications circuit 110. The external communications circuit can have the function of sending boot data to the microcontroller. An external non-volatile memory, such as external ROM 111, can also be provided to store boot data. External ROM 111 may store other data as well. In alternative embodiments, the external non-volatile memory can be another type of non-volatile memory, such as, for example, a flash memory.

In some embodiments the microcontroller is used to control a portable device, such as, for example a mobile phone featuring a multifunction touch screen. Since the microcontroller can be used to power a small device, it can be custom designed to perform specific predefined functions. For example, while most general purpose processors feature a register set, wherein each register is as long as the processor's usual word length (e.g., 32, or 64 bits), a custom designed microcontroller as featured in certain embodiments of the present invention can include a more unorthodox register file.

Figure 2A:
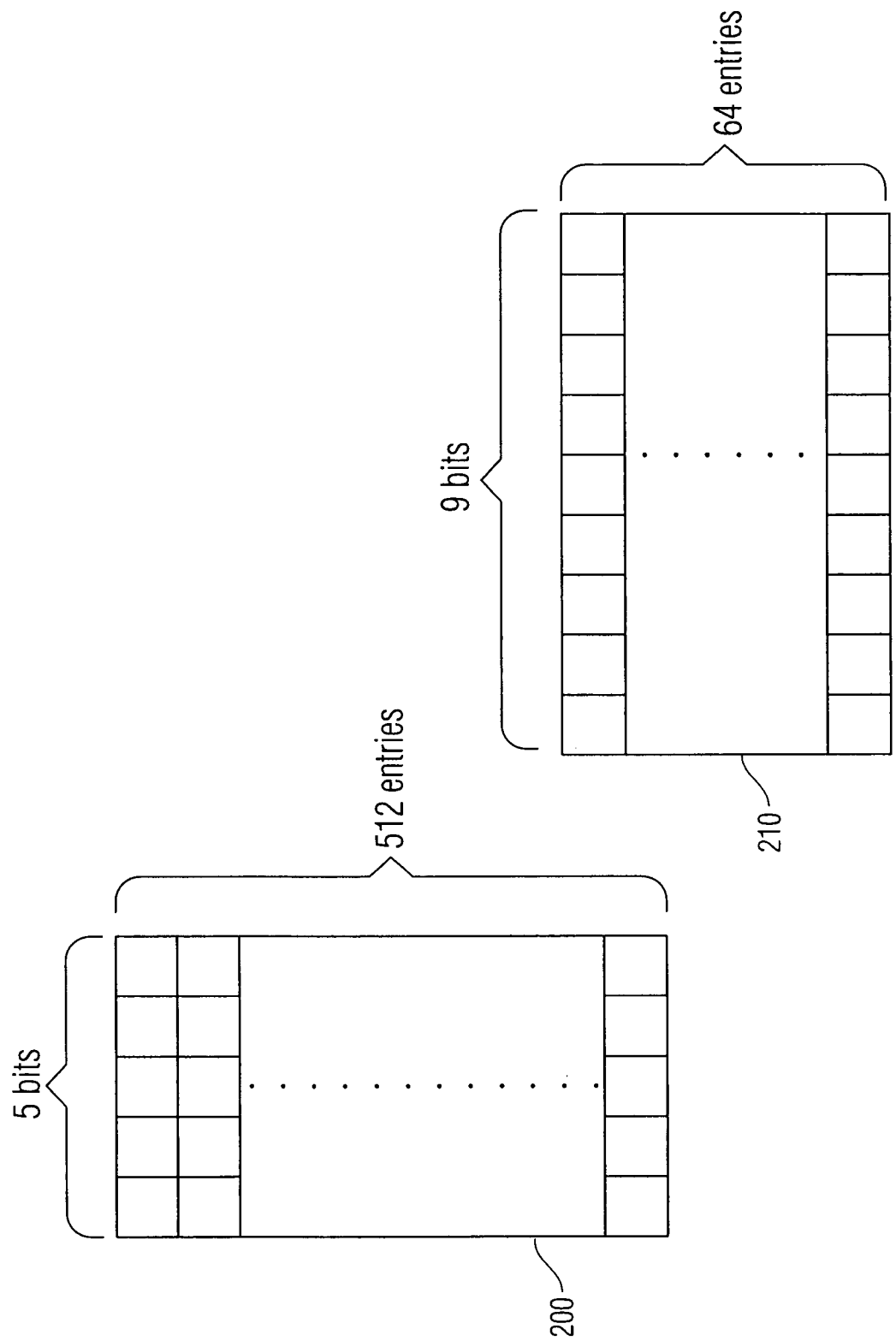
FIG. 2A shows an exemplary register file according to one embodiment of this invention.

FIG. 2A shows an exemplary register file according to an embodiment of the present invention. The register file includes two register sets—register set 200 and register set 210. The register file shown in FIG. 2A may correspond, for example, to a microcontroller with a 16-bit processor, i.e., microcontrollers featuring a 16-bit word size. Nevertheless, register set 200 comprises 512 five-bit registers, while register set 210 comprises 64 nine-bit registers. An embodiment of the present invention can feature a register file comprising of either of the two register sets, a combination of the two register sets, or an entirely different register set.

Thus, the size of the various registers can differ from the processor word size. This is the case because registers of unorthodox sizes may be chosen as best suited for certain specific predefined operations the microcontroller is to perform. For example, the microcontroller can be used to display images on a screen and each five-bit register of the register file 200 can represent a color value for a pixel on a screen.

The registers in the microcontroller's register file can be read and loaded in a manner similar to that of memory locations. Thus, each register can have an address associated with it, the address being part of an address space which also references the volatile memory 103 and any microcontroller ROM (if present). However, since the size of a register can be smaller than the microcontroller's word size, register read and write operations may have to be performed with words, wherein only a portion of the word is significant. For example, with a word size of 16, and the register set 200, an operation to write the value '10101' to a register may include the word '0000 0000 0001 0101' wherein only the 5 right most bits of the word are significant. A person of skill in the art would recognize that any other portion of the word may be considered significant (and the significant portion need not be continuous), and that the non-significant portion need not be filled with zeroes only.

Serial port interface 105, due to its serial nature, sends or receives data bit by bit to and from serial port 106. In some embodiments, a parallel port and a parallel port interface may be used. However, even in these embodiments, due to cost concerns the speed of data throughput at the interface is usually slower than that of the bus. That is the case because communications at the interface are usually performed through pins, which are usually expensive.

The serial port interface can be capable of direct access to memory 103 and in certain cases register file 102. Thus, the serial interface can write received data directly to a memory through a bus, instead of involving the processor and thus possibly causing a slow down of some other task the processor may be performing. Also, the serial port interface can be a master on bus 107 so that it can initiate memory write operations.

Figure 2B:
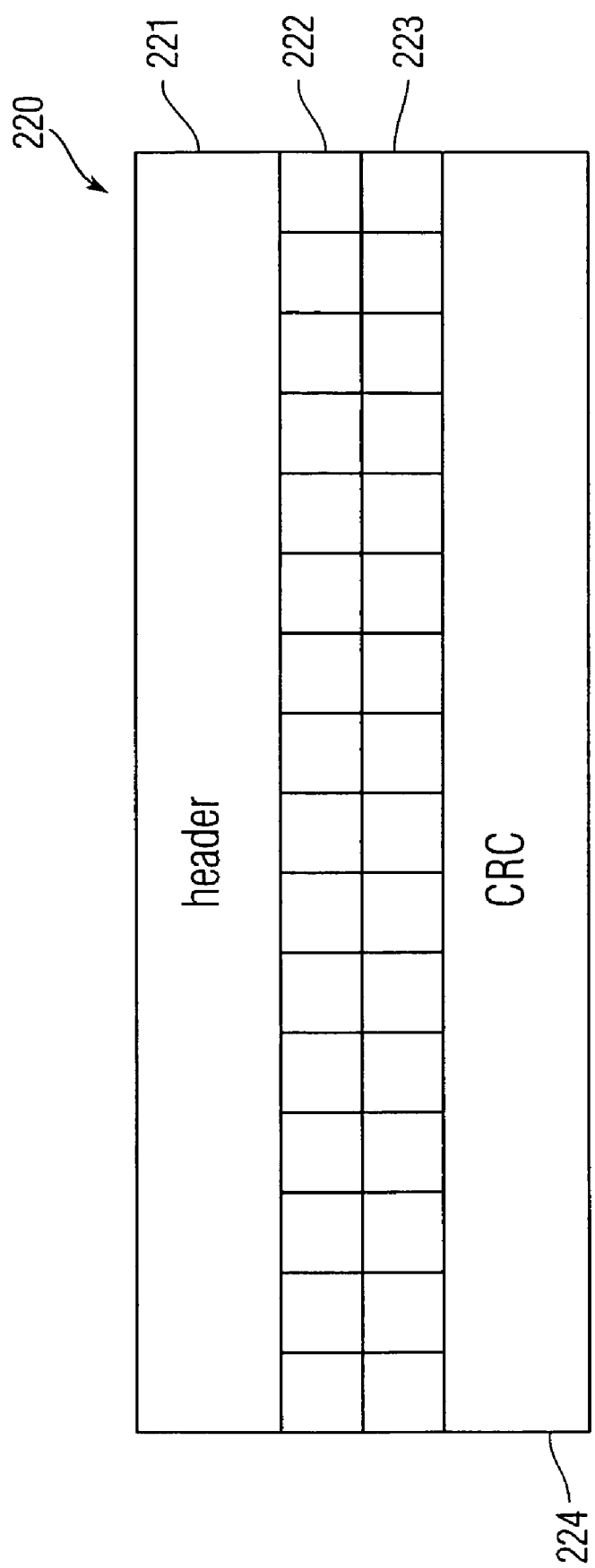
FIG. 2B is a diagram showing a sample communication to the microcontroller according to one embodiment of this invention.

The serial port interface operates according to predefined protocols to receive and/or send data. For example, FIG. 2B shows communication 220 which can be sent to the serial port interface from an external entity, such as external communications circuit 110. Communication 220 comprises header 221 which may have various different lengths and which indicates to the serial interface a communication type. For example the header may indicate that the communication is a memory write. The communication can also include 16-bit address 222, which indicates the address at which the memory should be written as well as 16-bit data 223 which is a word which is to be written at address 222.

The communication can also include a plurality of redundancy check bits 224, which check whether the communication has been correctly received. The redundancy check bits can be cyclic redundancy check (CRC bits). The redundancy check bits can be of different numbers depending on the redundancy check scheme being utilized. Other types of redundancy checking (other than CRC) can be utilized. For example, a simple checksum can be used instead of the CRC bits. The serial port interface can use the redundancy check bits to determine whether the communication was correctly received before writing it to memory, and/or request a repeat transmit of the communication if it were not correctly received. Having received the communication, the serial port interface can then communicate with memory 103 to write data 223 at address 222.

It is noted that address field 222 can reference a location in register file 102 instead of memory 103. Thus, communication 220 can be used to write to a register file.

In order for microcontroller 100 to commence ordinary operation, it can be required that certain predefined values be loaded in the registers of register file 102. These predefined values can be stored in ROM in the microcontroller itself and loaded in the register file by the processor. However, as discussed above, this method is not desired as it may fix the predefined values at the stage of production of the microcontroller and may not allow for later updates or error corrections.

The predefined values can be sent from an element external to the microcontroller (such as, for example, external communication circuit 110) to the microcontroller at time of boot up. For example, external circuit 100 can send a plurality of communications, such as communication 220, to serial port interface 105, wherein each communication includes an address of a register as well as a predefined value for that register. The serial port interface can then write the predefined values to register file 102.

However, in the present example, the boot up communications can take up too much time. For example, if the register file includes register set 200, then only five bits of 16-bit data field 223 would be significant. The other 11 bits would be irrelevant, but they would still need to be transmitted in order to satisfy the format of communication 220. Furthermore, many additional bits as part of the header, address and CRC fields must also be transmitted in order for these five significant payload bits to be transmitted. Therefore, using communications such as communication 220 to preload boot up register values may require the transmission of many overhead bits in relation to the number of significant payload bits. Thus, such a scheme would be slow, and generally slow down the boot up process. As discussed above, a slow boot up process can create a negative impression in the mind of a consumer. Therefore, a faster scheme for loading predefined values into the registers on boot up is required. For this purpose, embodiments of the present invention provide for sending compressed boot data into microcontroller 100, as discussed below.

Figure 3:
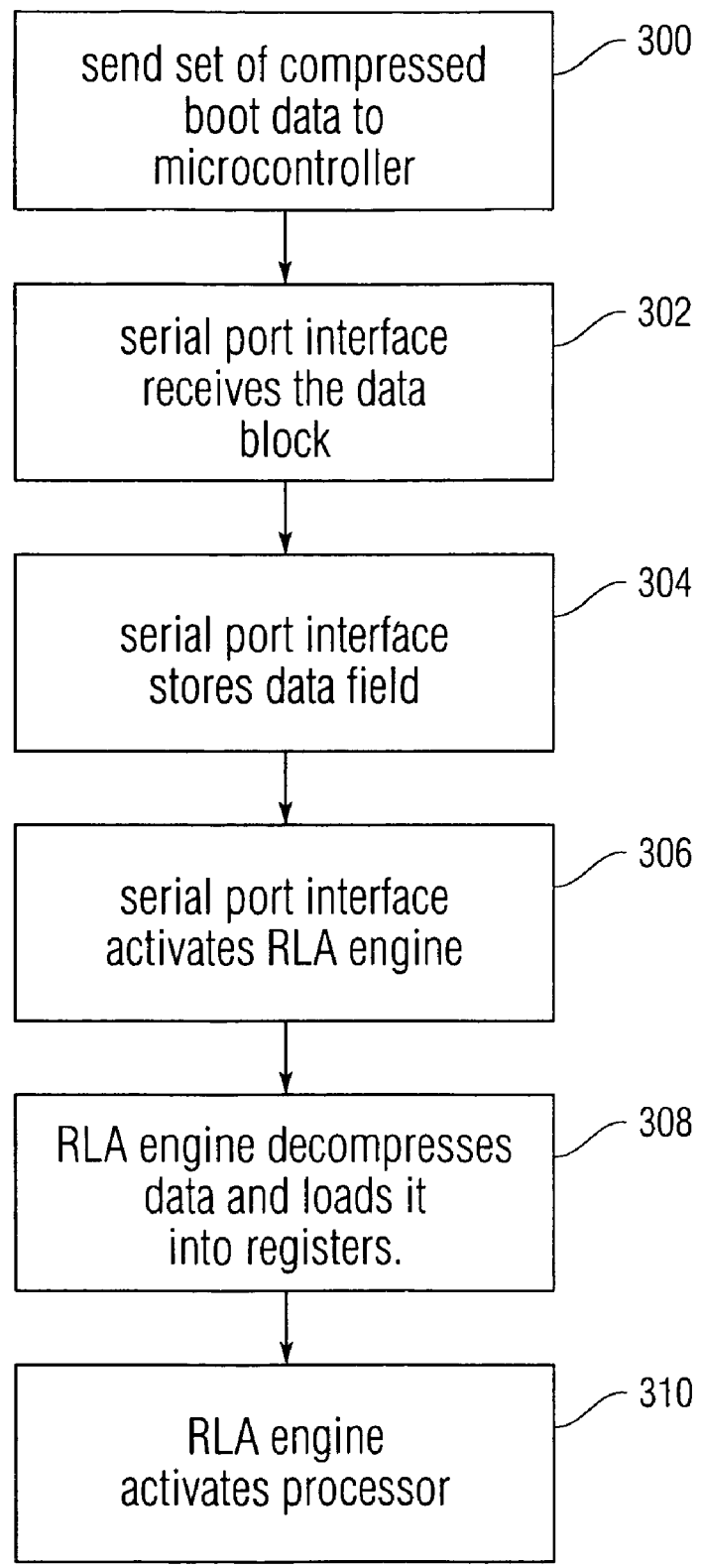
FIG. 3 is a flowchart showing a method of operation of one embodiment of this invention.

FIG. 3 is a flowchart showing a method of operation of embodiments of the present invention. At step 300, a set of compressed boot data is sent to the microcontroller. This can be performed, for example, by the external communication circuit 110. The external communications circuit can compress the boot data itself, receive boot data that has been compressed by another entity, or obtain the compressed boot data from a non-volatile memory (such as ROM 111) where it has been saved in its compressed form. Since the soot data is usually defined at the time of manufacture of a device and does not change during the life of the device, it may be suitable to save it in its compressed form in a static memory. In another embodiment the boot data can be stored in other types of non-volatile memory, such as, for example FLASH memory. In this embodiment, the boot data can be updated by the device if necessary.

Figure 4:
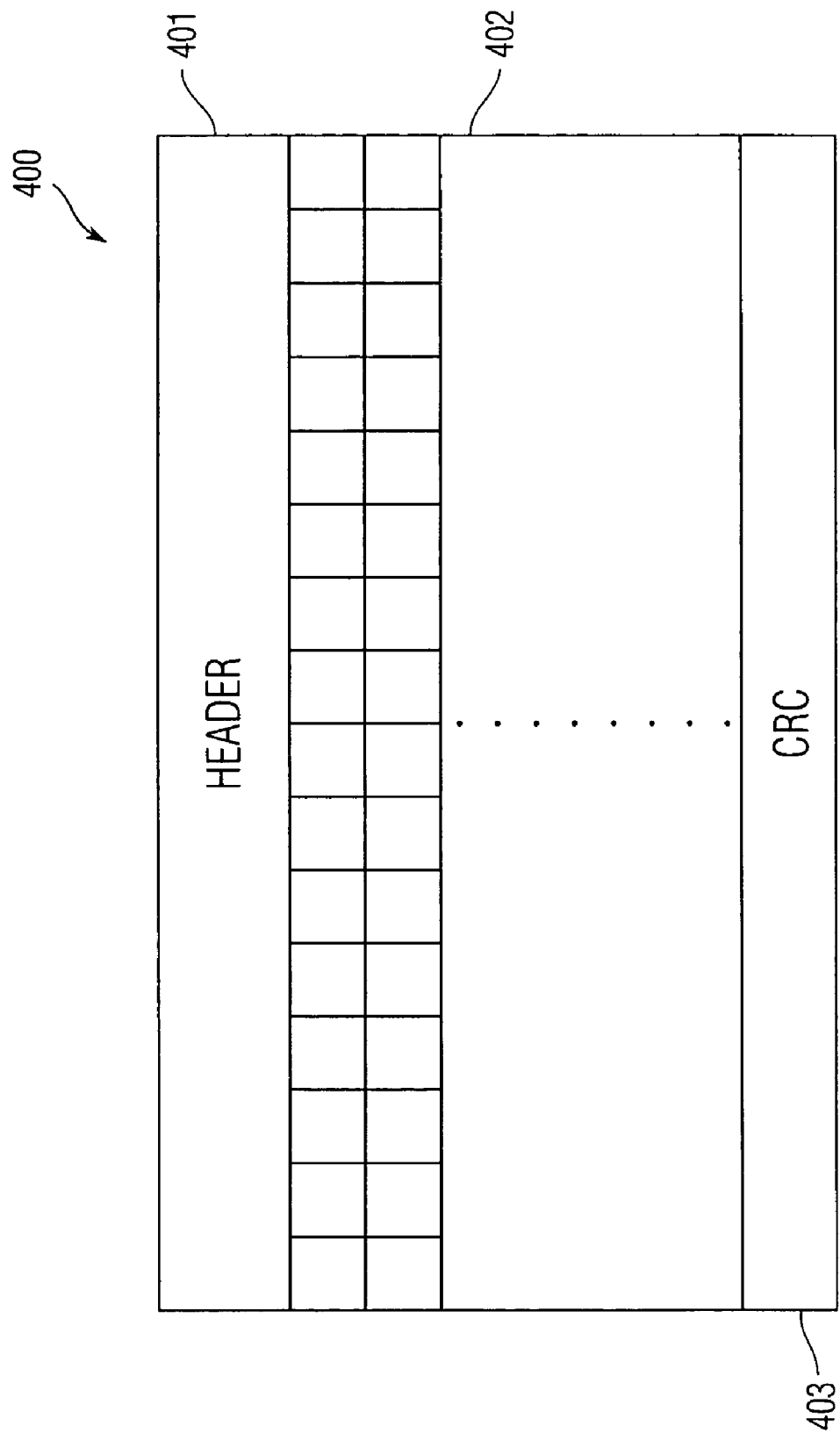
FIG. 4 is a diagram showing an exemplary block of boot data.

The boot data can be sent in a single block. FIG. 4 shows an exemplary block of boot data 400. Block 400 includes header 401 which identifies the block as a boot data block to the serial port interface. The block further includes data field 402, which includes the compressed boot data. In contrast to communication 220 shown in FIG. 2B, the data field can comprise a plurality of words. The size of data field 402 can be stored in the header 401. Cyclical redundancy check field 403 (or other redundancy check field, such as, e.g., a checksum) can also be part of the block.

Referring back to FIG. 3, at step 302, serial port interface 105 receives the data block 400. As part of receiving the data block, the serial port interface can perform a CRC check on the data block. The serial port interface can then store data field 402 of the data block in volatile memory 103. The serial port interface can store the data block in a location referenced by header 401. Alternatively, the serial port interface can store the data field in a predefined location which is associated with the boot up sequence. It is noted that while the data field can include initialization values of the registers within register file 102, it is not initially stored in the register file. This is the case because the data within the data field is still compressed and thus cannot be directly placed in the registers.

At step 306, the serial port interface, having finished saving the data field, can activate or invoke RLA engine 104. The RLA engine is used to decompress the data field into various register initialization values and to load these values into their respective registers. The RLA engine may access the volatile memory at a predetermined address associated with the boot up process. Alternatively, the RLA engine may receive an address from serial port interface 105 when it is being invoked by the serial port interface. In this case, this address may be initially included in header field 401.

The RLA engine can be considered in general to be a decompression engine. It may be implemented through a generally programmable processor. Alternatively, it can be implemented by an application specific circuit which can be specifically designed to perform the decompression function. For example, the RLA engine can be a specific application specific circuit within a larger application specific integrated circuit (ASIC) which defines the entire microcontroller 100. If implemented by an application specific circuit, the RLA engine can offer significant performance improvements over a general purpose processor. The RLA engine can be configured to retrieve and execute commands as part of decompression. Further details as to how the boot data is compressed and decompressed are provided below.

At step 308, the RLA engine accesses the compressed boot data from the volatile memory, decompresses it and uses it to load the various registers in register file 102. At step 310, the RLA engine has completed its task of decompressing the boot data, and performs a function that indicates that this stage of the boot process is complete. For example, the RLA engine may activate processor 101 by issuing an interrupt which indicates that the boot up process is over and the processor can proceed with ordinary operation. Alternatively, if the boot process is not complete, the RLA engine can invoke another element of the microcontroller which performs another portion of the boot process, or it can issue an interrupt to the microprocessor which indicates that a specific stage of the boot up process is completed in order to allow the microprocessor to proceed with additional stages.

In some embodiments, the compressed boot data can include data other than initial register values. For example, it can include initial memory values, or initial instructions. In such a case, the RLA engine can decompress and load instructions in an instruction memory (which can be part of volatile memory 103), or can decompress other initial memory values and load them in their intended memory locations.

Figure 5:
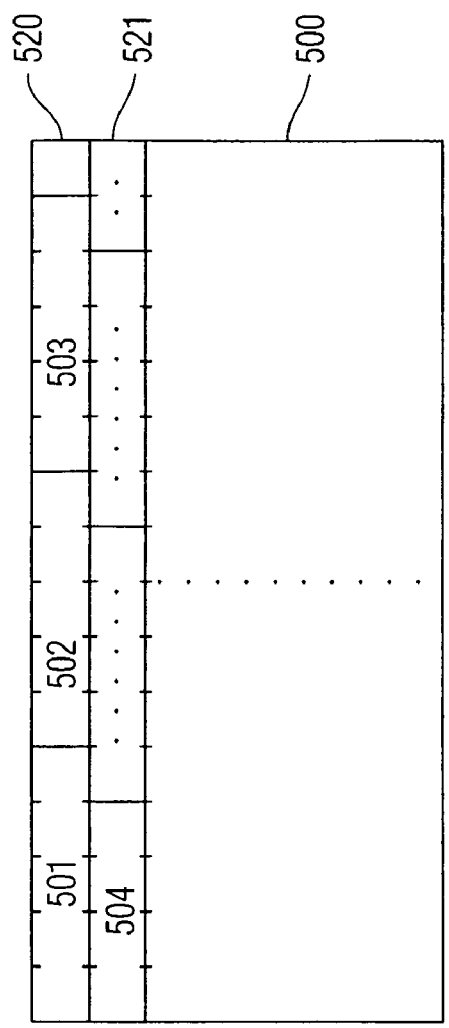
FIG. 5 is a diagram showing an exemplary organization of the compressed boot data.
Figure 5:
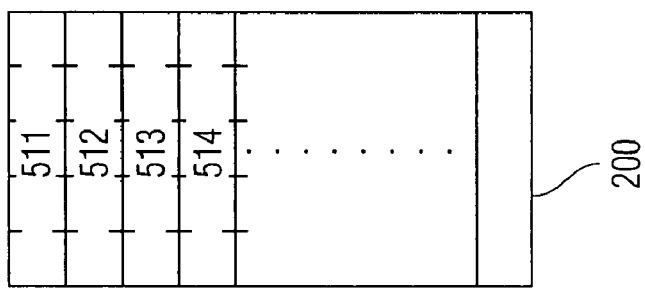

FIG. 5 shows an exemplary organization of the compressed boot data. Compressed boot data 500 is shown. That data can be the data included in data field 402 or copied in volatile memory 103. Also, register file 200 is shown. The compressed data may include a plurality of initial register values intended for the register file. Usually (see, e.g., discussion of FIG. 2B) each register value would be represented by a single 16-bit word 302. And since the register file 200 is five-bit, only five of the 16 bits of that word would be significant. In compressed boot data 500, only the significant bits are kept and the insignificant bits are removed. Therefore, if compressed data 500 holds initial values for register file 200, it can hold a series of five-bit values 501, 502, 503, 504, etc., each of which is an initial value intended for registers 511-514, respectively.

Since only five-bit values are held in the compressed data, they can be packed so that multiple values are held in each word. Thus values 501-503 are all placed in the first word 520, and additional values are placed in the following words. Also, in order to use space efficiently a single value can be placed in two words. For example value 504 is placed in the first and second words 520 and 521.

After the compressed data 500 is saved in a predefined location, the RLA engine can access the predefined location and load the values 501-504 into their respective registers. To perform this, the RLA engine can load a word (such as word 520) out of the predetermined location in memory, and obtain all register values or portions thereof from that word. The RLA engine can then place each obtained five-bit register value in a 16-bit word, filling in the rest of the space with insignificant bits. Thus, the RLA engine forms a full word which is more suitable for transmission over the bus 107. The RLA engine can then consecutively send each formed word to the register file with instructions to load these words into consecutive registers. Register file 102 can receive the words, strip off the insignificant bits, and load the significant five-bit values 501-504 into their respective registers 511-514. In practice, there can be much more than four registers and register values.

The above described compression scheme is relatively simple and can require a single predetermined method of decompression. In other words, since only a single data block is sent to the RLA engine, and no meta data or commands as to how to decompress the data are sent to the RLA engine, the RLA engine can only perform a single predefined method of decompression.

Figure 6:
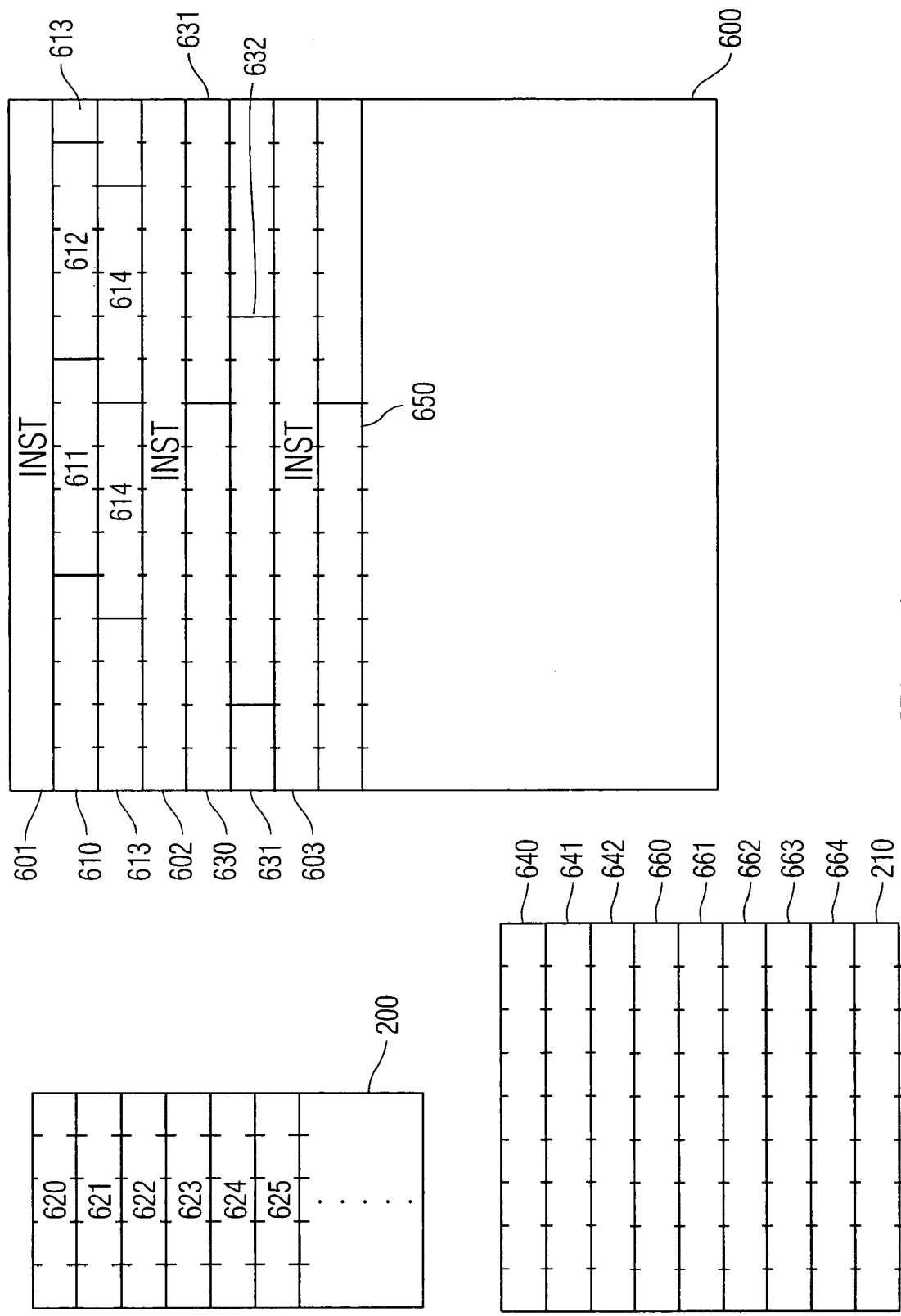
FIG. 6 is a diagram showing a second exemplary organization of the compressed boot data.

In more complex embodiments, the RLA engine can be configured to execute commands which have been placed in the compressed boot data. FIG. 6 shows an exemplary organization of the compressed data in such a more complex embodiment.

In such an embodiment the RLA engine may be able to retrieve and execute instructions from the compressed boot data. Instructions generally describe how the data should be decompressed and where it should be saved. For example an instruction can indicate one or more of the following: (i) how a certain portion of the data is compressed (and, consequently how it should be decompressed); (ii) where the portion of compressed data to which the instruction pertains has been placed; (iii) and where (e.g., in which registers) should the decompressed data be placed.

The use of instructions greatly increases the flexibility of the RLA engine. Thus, the various methods of compression can be modified without requiring changes in the design of the RLA engine. For example, with reference to compressed data 600 shown in FIG. 6, first instruction 601 can indicate that a certain portion of data must be decompressed in a manner similar to that described above with reference to FIG. 5. That is, the five-bit values 610-615 can be consecutively placed in respective five-bit registers 620 through 625. Instruction 601 may specifically refer to the compressed data on which the instruction is to be performed (i.e. the two words following the instruction). Alternatively, the data on which the instruction is to be performed may not be explicitly addressed by the instruction, but can be assumed to be a certain number of words (which number may be defined by the instruction) after the instruction. The data need not immediately follow its respective instruction. It can be placed in a different portion of compressed data 600 and referred to by the instruction.

Second instruction 602 can also be included in compressed data 600. The second instruction can state that the next two words are to be used to load the first three registers of nine-bit register set 210. Instruction 602 can refer to a decompression method similar to that of instruction 601. In other words, only the significant bits of the register values are kept in the compressed data, and the RLA engine must fill in the insignificant bits (e.g., with zeros) and send a load instruction across the bus to the respective register. Since register set 210 is nine bits wide, the RLA engine splits up the data in the next words in a different manner (i.e., in nine bit chunks) in order to load values 630, 631, and 632 into registers 640, 641 and 642.

Third instruction 603 can also be present. The third instruction can also refer to loading data in register set 210, but it can refer to a different decompression method. It can state that the value of the first nine bits 650 in the following word must be loaded in five consecutive registers 660-664 in register set 210. Therefore, the RLA engine can load the value 650, add the necessary insignificant bits to turn it into a full word, and load in it the five registers 660-664. This can be performed, for example, by sending five consecutive load instructions to register file 102 including the same value—value 650.

Instructions such as instruction 603 can be especially useful if many initial values of the registers are identical. For example, if a range of registers must be initially set to one, instruction 603 can define these values without using up much space, and thus can provide a high level of compression of compressed boot data 600.

Other types of instructions may also be used. For example, more complex methods of compression can be utilized. Thus, for example, certain instructions can indicate that a certain portion of the compressed data is coded using a type of variable length coding, such as Huffman coding. In such a case, the compressed data can include Huffman coded data as well as the necessary Huffman tables for decoding that data. In addition, run length encoding or other types of encoding can also be used.

While, FIG. 6 shows that instructions are dispersed in different positions within the compressed data, that does not need to be the case. In another embodiment, the instructions and the actual compressed data can be saved in two separate regions of the block 600. This way space can be utilized more efficiently. In other words, placing instructions in a separate region of memory provides that the requirement that the instructions are placed in whole words (this requirement may be present in some embodiments, in order to facilitate easier instruction retrieval) does not cause an unnecessary waste of space. For example, referring to FIG. 6, the space after data element 614 can be wasted, because instruction 602 may need to be placed in an entire word. The instructions may include references to the data they are associated with. Therefore, even if the instructions are placed in a separate area than the data, the RLA engine may use these references to access the data which the instructions relate to.

In general, the ability of the RLA engine to read and execute instructions from the compressed data allows the designers of a device to select and modify various types of boot data and the types of compression techniques the boot data is compressed by without necessitating a redesign of the RLA engine. While the RLA engine can be configured to execute instructions, it can nevertheless be an application specific circuit (which may be a part of a larger ASIC). In other words, it can be custom designed to execute specific compression and data loading algorithms and instructions, and not to perform the general operations of a general purpose processor. However, in another embodiment, the RLA engine can include a general purpose processor.

In one embodiment, the RLA engine can be configured to utilize processor 101 for more complex decompression tasks. The RLA engine may load processor instructions in the processor's instruction memory and activate the processor in order to perform certain operations (for example, more complex mathematical operations). The RLA engine can then obtain the results and load certain registers accordingly.

While the RLA engine has mostly been described above with respect to loading initial register values during a boot up procedure, it can also be configured to load values in other types of memory, such as volatile memory 103 in a similar manner. For example, as discussed above, the RLA engine may load processor instructions in volatile memory 103.

In one embodiment, the RLA engine is used in connection to a boot up process. However, another embodiment may use the RLA engine in ordinary operation as well. For example, if certain software needs to set a range of registers or memory to certain values, it can compress these values, place them in memory with appropriate RLA engine instructions, and activate the RLA engine. The RLA engine can then decompress the values according to the instructions and load the respective registers, and/or memory according to the values and the instructions. Since in many embodiments, the RLA engine comprises a custom designed circuit, it can be faster at its function than the processor 101. Furthermore, the RLA engine can operate in parallel with the processor 101. Therefore, it can be helpful to use the RLA engine outside of the boot process.

The external communications circuit 110 can send all necessary compressed boot data and instructions in one block, such as block 600. However, in one embodiment, the external communications circuit 110 can send the compressed boot data in two or more blocks.

Thus, when serial port interface 105 completes the storage of a first block in volatile memory 103, it can activate the RLA engine. The RLA engine can then proceed to read the stored data and decompress data and load registers and/or memory as necessary. The serial port interface can initiate the receipt of a second block of data, while the RLA engine is operating on the first block of data.

Thus, parallel operation of the serial block interface 105 and the RLA engine 104 can be achieved. This can result in further decreases of the time necessary for boot up. And while serial port interface 105, and RLA engine 104 can both need to use the bus 107 during their parallel operation, various bus control algorithms, or a bus arbitrator (if present) can allow for the bus to be shared by these two elements.

Figure 7:
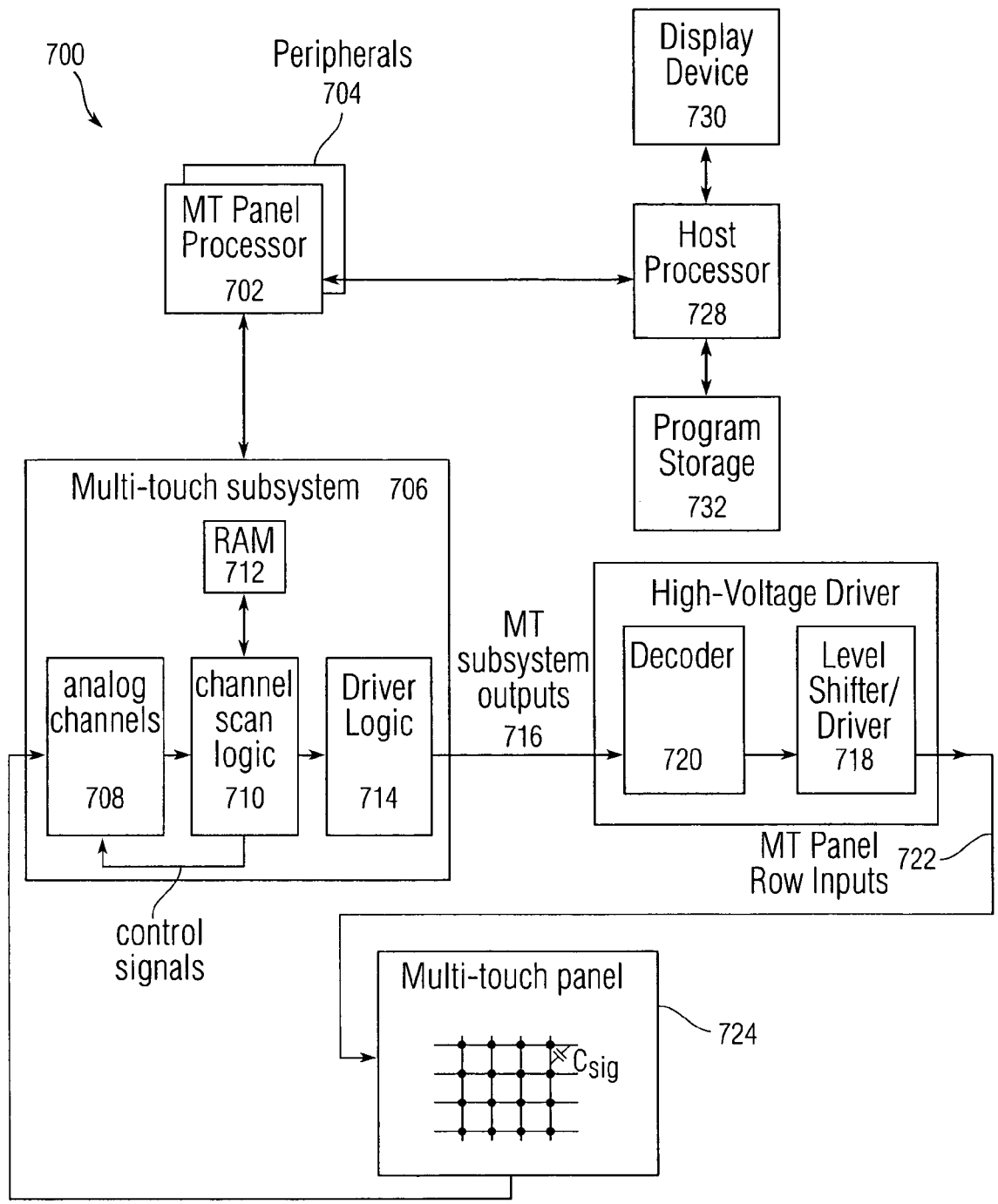
FIG. 7 is a diagram of a computing system which can include an embodiment of the present invention.

FIG. 7 is an overall diagram of a device which can be used in conjunction with the present invention. The device is a portable electronic device featuring a multi touch sensitive panel. However, as discussed above, the present invention is not limited to this device or a device of this type.

FIG. 7 illustrates exemplary computing system 100 that uses multi-touch panel 724. Computing system 700 can include one or more multi-touch panel processors 702 and peripherals 704, and multi-touch subsystem 706. One or more processors 702 can include, for example, ARM968 processors or other processors with similar functionality and capabilities. However, in other embodiments, the multi-touch panel processor functionality can be implemented instead by dedicated logic, such as a state machine. Peripherals 704 may include, but are not limited to, random access memory (RAM) or other types of memory or storage, watchdog timers and the like. Multi-touch subsystem 706 can include, but is not limited to, one or more analog channels 708, channel scan logic 710 and driver logic 714. Channel scan logic 710 can access RAM 712, autonomously read data from the analog channels and provide control for the analog channels. This control can include multiplexing columns of multi-touch panel 724 to analog channels 708. In addition, channel scan logic 710 can control the driver logic and stimulation signals being selectively applied to rows of multi-touch panel 724. In some embodiments, multi-touch subsystem 706, multi-touch panel processor 702 and peripherals 704 can be integrated into a single application specific integrated circuit (ASIC).

Driver logic 714 can provide multiple multi-touch subsystem outputs 716 and can present a proprietary interface that drives high voltage driver, which is comprised of decoder 720 and subsequent level shifter and driver stage 718, although level-shifting functions could be performed before decoder functions. Level shifter and driver 718 can provide level shifting from a low voltage level (e.g. CMOS levels) to a higher voltage level, providing a better signal-to-noise (S/N) ratio for noise reduction purposes. Decoder 720 can decode the drive interface signals to one out of N outputs, whereas N is the maximum number of rows in the panel. Decoder 720 can be used to reduce the number of drive lines needed between the high voltage driver and multi-touch panel 724. Each multi-touch panel row input 722 can drive one or more rows in multi-touch panel 724. In some embodiments, driver 718 and decoder 720 can be integrated into a single ASIC. However, in other embodiments, driver 718 and decoder 720 can be integrated into driver logic 714, and in still other embodiments, driver 718 and decoder 720 can be eliminated entirely.

Multi-touch panel 724 can in some embodiments include a capacitive sensing medium having a plurality of row traces or driving lines and a plurality of column traces or sensing lines, although other sensing media may also be used. The row and column traces may be formed from a transparent conductive medium, such as Indium Tin Oxide (ITO) or Antimony Tin Oxide (ATO), although other transparent and non-transparent materials, such as copper, can also be used. In some embodiments, the row and column traces can be formed on opposite sides of a dielectric material, and can be perpendicular to each other, although in other embodiments other non-orthogonal orientations are possible. For example, in a polar coordinate system, the sensing lines can be concentric circles and the driving lines can be radially extending lines (or vice versa). It should be understood, therefore, that the terms "row" and "column," "first dimension" and "second dimension," or "first axis" and "second axis" as used herein are intended to encompass not only orthogonal grids, but the intersecting traces of other geometric configurations having first and second dimensions (e.g. the concentric and radial lines of a polar-coordinate arrangement). It should also be noted that in other embodiments, the rows and columns can be formed on a single side of a substrate, or can be formed on two separate substrates separated by a dielectric material. In some embodiments, the dielectric material can be transparent, such as glass, or can be formed from other materials, such as mylar. An additional dielectric cover layer may be placed over the row or column traces to strengthen the structure and protect the entire assembly from damage.

At the "intersections" of the traces, where the traces pass above and below each other (but do not make direct electrical contact with each other), the traces essentially form two electrodes (although more than two traces could intersect as well). Each intersection of row and column traces can represent a capacitive sensing node and can be viewed as picture element (pixel) 726, which can be particularly useful when multi-touch panel 724 is viewed as capturing an "image" of touch. (In other words, after multi-touch subsystem 706 has determined whether a touch event has been detected at each touch sensor in the multi-touch panel, the pattern of touch sensors in the multi-touch panel at which a touch event occurred can be viewed as an "image" of touch (e.g. a pattern of fingers touching the panel).) The capacitance between row and column electrodes appears as a stray capacitance on all columns when the given row is held at DC and as a mutual capacitance Csig when the given row is stimulated with an AC signal. The presence of a finger or other object near or on the multi-touch panel can be detected by measuring changes to Csig. The columns of multi-touch panel 724 can drive one or more analog channels 708 (also referred to herein as event detection and demodulation circuits) in multi-touch subsystem 706. In some embodiments, each column is coupled to one dedicated analog channel 708. However, in other embodiments, the columns may be couplable via an analog switch to a fewer number of analog channels 708.

Computing system 700 can also include host processor 728 for receiving outputs from multi-touch panel processor 702 and performing actions based on the outputs that may include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 728 may also perform additional functions that may not be related to multi-touch panel processing, and can be coupled to program storage 732 and display device 730 such as an LCD display for providing a user interface (UI) to a user of the device.

Multi touch panel processor 704 can be implemented as part of the microcontroller of the present invention. Random access memory 712 can be part of the same microcontroller as the multi-touch processor.

The above described system can be, for example, a mobile telephone with a touch sensitive screen. It can also belong to a number of other types of portable and non-portable electronic devices, such as PDAs, portable music players, etc. The present invention may provide for a significant overall benefit to the device, as a shorter boot period would generally create a much more favorable impression of the device in the mind of a user of the device. However, the present invention may be used in the context of other devices or systems as discussed below.

A person of skill in the art would recognize that various modifications can be made to the embodiments discussed herein, without departing from the scope of the present invention. For example, RLA engine 104 can be implemented as part of the serial port interface 105.

Also, while the embodiments discussed herein usually provide that the processor is not active during the boot operation, some embodiments can feature a more active processor. For example, the processor can operate based on instruction in a non-volatile memory within the microcontroller and it may perform various functions, such as activating the serial port interface, activating the RLA engine, etc.

While the embodiments discussed herein have been mostly described in the context of a microcontroller for a portable device this need not be the case. The present invention can be adapted to any computing system which requires some external boot data to be received over a relatively slow (or otherwise inexpensive) interface, and are thus not limited to a microcontroller or to a portable device. For example the present invention can be used in the context of computers, servers, or mainframes which need to boot up by loading boot data from an external source for various reasons. These reasons may be to ensure uniformity, to ensure security, to prevent unauthorized use of the systems, etc.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. A method for entering data into a register file of a processing module, the processing module including a processor and an application specific decompression engine distinct from the processor, the method comprising:
    storing a first set of data into an intermediate memory, the first set of data comprising instructions and a set of compressed data including compressed initial register values to be stored in the register file of the processing module;
    reading from the intermediate memory the compressed initial register values by the decompression engine;
    retrieving a first set of one or more instructions from the first set of data by the decompression engine;
    decompressing the compressed initial register values by the decompression engine to produce a set of decompressed initial values, wherein the decompressing is performed in accordance with the retrieved instructions;
    transferring the decompressed initial values over an internal bus of the processing module to the register file of the processing module, and
    saving in the register file the transferred decompressed initial values.

2. The method of claim 1, wherein the method is performed as part of a boot up procedure, and further including alerting the processor of the completion of a boot up procedure by the decompression engine.

3. The method of claim 1, further including receiving the first set of data from a source external to the processing module through a port of the processing module.

4. The method of claim 3, wherein the port of the processing module has a data transfer speed which is slower than a data transfer speed of the internal bus of the processing module.

5. The method of claim 1, wherein the processing module is a microcontroller.

6. The method of claim 1, wherein the decompression engine is an application specific circuit.

7. The method of claim 1, wherein decompressing the compressed initial register values further includes:
    retrieving a reference to the set of compressed initial register values within the first set of data from the one or more instructions; and
    accessing the set of compressed initial register values based on the reference.

8. The method of claim 1, wherein decompressing the set of compressed data further includes:
    retrieving an indication of a method of decompression from the one or more instructions; and
    decompressing the set of compressed initial register values according to the method of decompression.

9. The method of claim 8, further including:
    retrieving a second set of one or more instructions;
    retrieving a second indication of a second method of decompression from the second set of instructions, the second method of decompression being distinct from the method of decompression; and decompressing a second set of compressed initial register values within the first set of data according to the second method of decompression.

10. The method of claim 1, wherein the register file comprises a plurality of registers and the size of each register in the register file is less than the processor word size.

11. The method of claim 1, wherein transferring the decompressed initial values over an internal bus comprises expanding the decompressed initial values into a bus word size optimized for transmission over the internal bus, and saving the transferred decompressed initial values includes reducing the bus word size into a word size optimized for storing in the register file.

12. The method of claim 1, wherein decompressing the compressed initial register values further comprises:

obtaining a value having a first number of significant bits from the compressed initial register values; and appending a second number of insignificant bits to the value in order to form a resulting value of the processor's word size.

13. The method of claim 1, wherein decompressing the set of compressed initial register values further comprises Huffman decoding the set of compressed initial register values.

14. The method of claim 1, wherein decompressing the set of compressed initial register values further comprises run length decoding the set of compressed initial register values.

15. The method of claim 1, further comprising:

receiving the first set of data by a communications interface of the processing module; and activating the decompression engine by the communications interface;

wherein the storing of the first set of data is performed by the communications interface.

16. A method of loading initialization values into a microcontroller comprising a processor and a decompression engine, the method comprising:

receiving a set of data from a source external to the microcontroller by a communications interface of the microcontroller, the set of data including instructions and compressed initialization values, the compressed initialization values to be loaded into a register file of the microcontroller;

saving the set of data in a memory by the communications interface;

activating the decompression engine by the communications interface;

decompressing at least a portion of the set of data by the decompression engine in accordance with the instructions to obtain decompressed initialization values corresponding to the compressed initialization values;

transferring the decompressed initialization values over an internal bus of the microcontroller to a register file of the microcontroller, and saving in the register file the transferred decompressed initialization values.

17. The method of claim 16 wherein the decompression engine comprises application specific circuits.

18. The method of claim 16, wherein the instruction includes a reference to a method of decompression, and the at least a portion of the set of data is decompressed according to the method of decompression.

19. The method of claim 16, wherein the register file comprises a plurality of registers and the size of each register in the register file is less than the processor word size.

20. The method of claim 16, further including notifying the processor of a completion of a boot up task by the decompression engine.

21. An electronic device comprising:

a processing module further including a processor having an internal bus and a register file, a memory connected to the processor over the internal bus, and a decompression engine connected to the processor and the memory over the internal bus and comprising application specific electronics configured to retrieve a set of data comprising a set of one or more instructions and compressed data including initialization values from the memory, execute the one or more instructions in order to decompress the set of compressed data, decompress the set of compressed data to obtain a set of uncompressed data, transferring the uncompressed data over the internal bus of the processor to the register file of the processor, and the register file operative to save the set of uncompressed data to registers within the register file; and a compressed data source external to the processing module, the data source including the set of data and configured to send the set of data to the processing module.

22. The electronic device of claim 21, wherein the compressed data source further comprises a non-volatile memory, which comprises the set of data.

23. The electronic device of claim 21, wherein the register file comprises a plurality of registers and the size of each register in the register file is less than the processor word size.

24. The electronic device of claim 21, wherein the one or more instructions further comprise a reference to a decompression method, and the decompression engine is further configured to use the decompression method to decompress the set of compressed data.

25. The electronic device of claim 21, wherein the processing module is a microcontroller.

26. The electronic device of claim 21, wherein the processing module further comprises:

a communications port connected to the compressed data source; and wherein the internal bus features a data transfer rate which is faster than that of the communications port.

27. The electronic device of claim 26, wherein the communications port is a serial port, and the internal bus is a parallel bus.

28. The electronic device of claim 26, wherein the processing module further comprises a communications interface comprising digital logic configured to cause the communications interface to:

receive the set of data from the compressed data source;

save the set of data into the memory; and activate the decompression engine.

29. The electronic device of claim 21, wherein the initialization values are required for a boot up procedure.

30. The electronic device of claim 21, wherein the electronic device is a mobile telephone.

31. The electronic device of claim 21, wherein the electronic device is a portable audio player.

32. An electronic device comprising:

a processing module further comprising a processor having an internal bus and a register file, means for storing data in a memory connected to the processor, retrieval means for retrieving from the memory a set of data comprising one or more instructions and a set of compressed data, wherein the compressed data includes initialization values to be stored in the register file of the processor, decompression means for executing the one or more instructions to decompress the set of compressed data to obtain a set of uncompressed data, means for transferring the decompressed data over the internal bus to the register file, and storage means for storing the set of uncompressed data in registers of the register file; and external data source means for sending the set of data to the processing module, the external data source means being external to the processing module.

33. A micro controller comprising:
a processor;
a register file;
a receiving means for receiving a set of data from a source external to the microcontroller, the set of data including one or more instructions and compressed data including compressed initialization values;
a storage means for storing the set of data in a memory;
a decompression means for decompressing the compressed data in accordance with the one or more instructions to obtain a set of decompressed data including decompressed initialization values, the decompression means further transmitting the decompressed initialization values the register file; and
a decompressed data storage means for storing the set of decompressed data into a destination memory;
wherein the decompression means are distinct from the processor.

34. A mobile telephone comprising:
a processing module further comprising
a processor having an internal bus and a register file,
a memory connected to the processor over the internal bus, and
a decompression engine connected to the processor and the memory over the internal bus and comprising application specific electronics configured to
retrieve a set of data comprising a set of one or more instructions and compressed data including initialization values from the memory,
execute the one or more instructions in order to decompress the set of compressed data,
decompress the set of compressed data to obtain a set of uncompressed data,
transferring the uncompressed data over the internal bus of the processor to the register file of the processor, and
save the set of uncompressed data to registers within the register file; and
a compressed data source external to the processing module, comprising the set of data and configured to send the set of data to the processing module.

35. A digital audio player comprising:
a processing module further comprising
a processor having an internal bus and a register file,
a memory connected to the processor over the internal bus, and
a decompression engine connected to the processor and the memory over the internal bus and comprising application specific electronics configured to
retrieve a set of data comprising a set of one or more instructions and compressed data including initialization values from the memory,
execute the one or more instructions in order to decompress the set of compressed data,
decompress the set of compressed data to obtain a set of uncompressed data,
transferring the uncompressed data over the internal bus of the processor to the register file of the processor, and
save the set of uncompressed data to registers within the register file; and
a compressed data source external to the processing module, comprising the set of data and configured to send the set of data to the processing module.

36. A method for entering data into a register file of a processing module, the processing module including a processor and a decompression engine, the method comprising:
storing in an intermediate memory, compressed initial register values to be stored in the register file of the processing module;
reading from the intermediate memory the compressed initial register values by the decompression engine;
decompressing the compressed initial register values by the decompression engine to produce a set of decompressed initial values;
transferring the decompressed initial values to the register file of the processing module, and
saving in the register file the transferred decompressed initial values.

37. The method as recited in claim 36 further comprising:
configuring the register file to have a word length smaller than a word length of the intermediate memory.

38. The method as recited in claim 36
wherein transferring the decompressed initial values comprises:
transferring the decompressed initial values over an internal bus of the processing module and
expanding the decompressed initial values into a bus word size optimized for transmission over the internal bus, and
wherein saving the transferred decompressed initial values includes:
reducing the bus word size into a word size optimized for storing in the register file.

39. The method as recited in claim 37
wherein transferring the decompressed initial values comprises:
transferring the decompressed initial values over an internal bus of the processing module and
expanding the decompressed initial values into a bus word size optimized for transmission over the internal bus, and
wherein saving the transferred decompressed initial values includes:
reducing the bus word size into a word size optimized for storing in the register file.

40. An electronic device comprising:
a processing module further including
a processor having an internal bus and a register file,
a memory connected to the processor over the internal bus, and
a decompression engine connected to the processor and the memory over the internal bus and configured to
retrieve compressed initialization values from the memory,
decompress the compressed initialization values to obtain a set of uncompressed initialization values,
transfer the uncompressed initialization to the register file of the processor, and save the set of uncompressed initialization values to registers within the register file.

41. The electronic device as recited in claim 40 wherein the transfer of the uncompressed initialization values includes transferring the uncompressed initialization values over an internal bus of the processor and expanding the uncompressed initialization values into a bus word size optimized for transmission over the internal bus, and the saving of the set of uncompressed initialization values includes reducing the bus word size into a word size optimized for storing in the register file.

42. The electronic device as recited in claim 41 wherein the register file word length is smaller than the word length of the memory.

43. The electronic device as recited in claim 40 wherein the register file word length is smaller than the word length of the memory.

44. The electronic device as recited in claim 40 further comprising:
a compressed data source external to the processing module, the compressed data source including the initialization values and configured to send the initialization values to the processing module.

45. The electronic device as recited in claim 40 wherein the electronic device comprises a micro controller, a mobile telephone, or a digital audio player.

* * * * *

UNITED STATES PATENT AND TRADEMARK OFFICE
CERTIFICATE OF CORRECTION

PATENT NO.         : 7,861,073 B2                                Page 1 of 1
APPLICATION NO.    : 11/650183
DATED              : December 28, 2010
INVENTOR(S)        : Thomas James Wilson It is certified that error appears in the above-identified patent and that said Letters Patent is hereby corrected as shown below:

In column 5, line 39, delete "soot" and insert -- boot --, therefor.

Signed and Sealed this
Eighth Day of November, 2011

David J. Kappos
*Director of the United States Patent and Trademark Office*